United States Patent
Ramones et al.

(10) Patent No.: US 9,620,887 B2
(45) Date of Patent: Apr. 11, 2017

(54) NETWORK DEVICE WITH RECONFIGURABLE POWER CORD ASSEMBLY

(71) Applicant: NETGEAR, Inc., San Jose, CA (US)

(72) Inventors: John Kui Yin Ramones, San Ramon, CA (US); Charles Lyman Bates, III, Oakland, CA (US); Yulian Bagirov, Oakland, CA (US); Jared Hull Aller, Oakland, CA (US)

(73) Assignee: Netgear, Inc., San Jose, CA (US)

( * ) Notice: Subject to any disclaimer, the term of this patent is extended or adjusted under 35 U.S.C. 154(b) by 0 days.

(21) Appl. No.: 14/819,580

(22) Filed: Aug. 6, 2015

(65) Prior Publication Data

US 2017/0040734 A1    Feb. 9, 2017

(51) Int. Cl.
   *H01R 13/60*   (2006.01)
   *H01R 13/502*  (2006.01)
   *H01R 43/26*   (2006.01)

(52) U.S. Cl.
   CPC ........... *H01R 13/502* (2013.01); *H01R 43/26* (2013.01)

(58) Field of Classification Search
   CPC ...... H01R 13/502; H01R 43/26; H01R 24/38; H01R 13/514; H01R 13/22; H01R 13/6658; F04D 25/088
   USPC .......................................................... 439/529
   See application file for complete search history.

(56) References Cited

U.S. PATENT DOCUMENTS

| | | | | |
|---|---|---|---|---|
| 4,708,661 A | * | 11/1987 | Morland | H01R 13/6658 439/218 |
| 6,146,191 A | * | 11/2000 | Kerr, Jr. | F04D 25/088 439/140 |
| 6,409,531 B1 | * | 6/2002 | Millard | H01R 13/22 439/289 |
| 6,997,740 B2 | * | 2/2006 | Kerr | F04D 25/088 439/318 |
| 9,028,274 B2 | * | 5/2015 | Zien | H01R 13/514 439/527 |
| 2008/0305693 A1 | * | 12/2008 | Mei | H01R 13/514 439/701 |
| 2016/0164199 A1 | * | 6/2016 | Hashimoto | H01R 24/38 439/578 |

* cited by examiner

*Primary Examiner* — Jean F Duverne

(57) ABSTRACT

A network device and a method of use are configured for ease of installation and use. The network device has a housing on which is provided a plurality of ports. A power cord assembly has a body bearing a cord and a connector for mating with a power input. Depending on the orientation of the body relative to the housing, the connector can be connected to the power port in at least first and second positions in which the power cord extends in first and second directions that are offset from one another. The network device may be easily mounted to a base, which is attached to a mounting surface. The base allows the network device to be mounted horizontally, vertically, or at any desire angle, without the disadvantages of mounting a typical network device.

20 Claims, 9 Drawing Sheets

NETWORK DEVICE WITH RECONFIGURABLE POWER CORD ASSEMBLY

BACKGROUND OF THE INVENTION

1. Field of the Invention

The invention relates generally to computer networking devices, and more particularly, relates to a network device such as a switch, hub, or router with a power cord assembly associated with a detachable base that are connectable to be associated in at least two different orientations relative to the device. The invention additionally relates to such a power cord assembly and to a method of connecting a power cord assembly to such a device.

2. Discussion of the Related Art

In today's technological world, there is an ever-increasing use of and reliance on computer networks to allow computers to exchange data. Network devices are used to physically and/or electronically connect devices together in order to create or connect networks. Network devices include, but are by no means limited to switches, hubs, and routers. Such devices usually are supplied with power via a cable, and may also be connected to one or more other devices by other cables, such as data cables.

Many older and even newer facilities are not equipped to conveniently and attractively mount network devices for use by the consumer. For instance, consumers commonly desire network devices to be mounted in or near wiring closets, training facilities, lab benches, conference rooms, and entertainment centers. However, furniture and/or equipment in these environments often are ill-equipped to facilitate the organization and connection of wires, cables, and bulky power adapters of network devices, resulting in the overall appearance of the network devices being diminished. Many installations of network devices to furniture and/or equipment rely upon consumer "do it yourself" arrangements that are haphazardly put together. This is an inconvenience to the consumer and an eyesore. Therefore, it is desired to improve the awkward and ill-equipped installations of current network devices.

The typical network device has generally a rectangular enclosure containing a number of ports arranged in a row or multiple rows on a front side of the enclosure. These ports usually are referred to as "data ports." The data ports are used for connecting multiple network devices via cables. A power port or socket typically is provided in the rear of the enclosure, opposite the data ports, for connecting the network device to a power source. Additional data ports also may be provided on the rear of the enclosure in the vicinity of the power port.

Cords must be coupled to each of these ports in a single, invariable orientation. The resulting lack of connection versatility might be inconvenient to many users and in many installation arrangements. Additionally, the location on the power port on typical network device enclosure may not allow the device to be installed in certain desired environments, such as on a wall, strapped to a pole, under a table, or in a server closet, due to its size, shape, or positioning of the ports and inputs. Moreover, most network devices lack any convenient mechanism to attach the device to a wall, pole, or underneath a surface without improvising a mounting mechanism for the switch to the surface.

In light of the foregoing, a network device, which is capable of receiving a power cord in multiple orientations, is desired.

Also, a network device, which allows the power cord to extend from multiple orientations, is desired.

A mechanism facilitating the mounting of a network device on a surface also is desired.

A method of connecting a cord to a network device in a selected one or two or more possible orientations is also desired.

SUMMARY OF THE INVENTION

One or more of the above-identified needs are met by providing a network device, such as a switch, having a housing with a power port, and a power cord assembly for coupling with the housing. The power port of the housing may be a female receptacle for receiving a male connector of the power cord assembly. The power cord assembly has a plug body having several surfaces. A power cable extends from a second surface of the plug body. The male connector may extend from a first surface of the plug body so as to be matable with the power port in at least two distinct orientations of the plug body relative to the housing. In the first orientation, the power cable extends in a first direction with respect to the housing. Then, rotation of the plug body about an axis substantially perpendicular to the first surface to a second orientation results in the power cord extending in a second direction with respect to the housing. The first direction and the second direction may be offset by 90 degrees or more.

In one embodiment, the power port input is a female receptacle and the connector is a male connector.

In one embodiment, the second surface is offset approximately 90 degrees from the first surface.

In one embodiment, the second surface is offset less than 90 degrees from the first surface.

In one embodiment, the power port is located at an inclined surface on a corner of the housing.

In one embodiment, the plug body has a triangular cross section and the plug body is connectable to the housing in either of exactly two orientations that are offset from one another by 180°.

In one embodiment, the plug body has a rectangular cross section and the connector body is connectable to the housing in any of exactly four mutually orthogonal orientations.

In accordance with another aspect of the invention, a power cord assembly has a plug body having a first surface and a second surface. A connector extends from the first surface and is configured to be connectable to a power port in a first orientation of the plug body. A power cable extends from the second surface. The second surface offset is no more than 90 degrees from the first surface and extends in a first direction relative to the power port when the connector is in the first orientation thereof. The connector is configured to rotate about an axis substantially perpendicular to the first surface to a second orientation in which the power cord extends in second direction relative to the power port and to be connectable to the power port in the second orientation thereof.

In accordance with yet another aspect of the invention, a method of connecting a power plug to a network device is provided including the steps of providing, connecting the connector of a plug body to the power port of a network device having one or more of the characteristics described above with the plug body in a first orientation in which the power cord extends in a first direction; then removing the connector from the power port and repositioning the plug body to a second orientation in which the power cord extends in a second direction; then connecting to the connector into the power port with the plug body in the second orientation thereof and the power cord extending in a second direction that is offset from the first direction. This offset could, for example, be 90° or a multiple thereof.

These and other objects, advantages, and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Preferred exemplary embodiments of the invention are illustrated in the accompanying drawings in which like reference numerals represent like parts throughout, and in which.

DETAILED DESCRIPTION OF THE PREFERRED EMBODIMENTS

A wide variety of cord and plug assemblies could be constructed in accordance with the invention as defined by the claims. Any one of these assemblies could be used in conjunction with any of a number of network devices, such as routers, hubs, computers, printers, servers, and switches. Hence, while the preferred embodiments of the invention will now be described with reference to a cord and plug assembly for use with a network switch 10, it should be understood that the invention is in no way so limited.

Figure 1A:
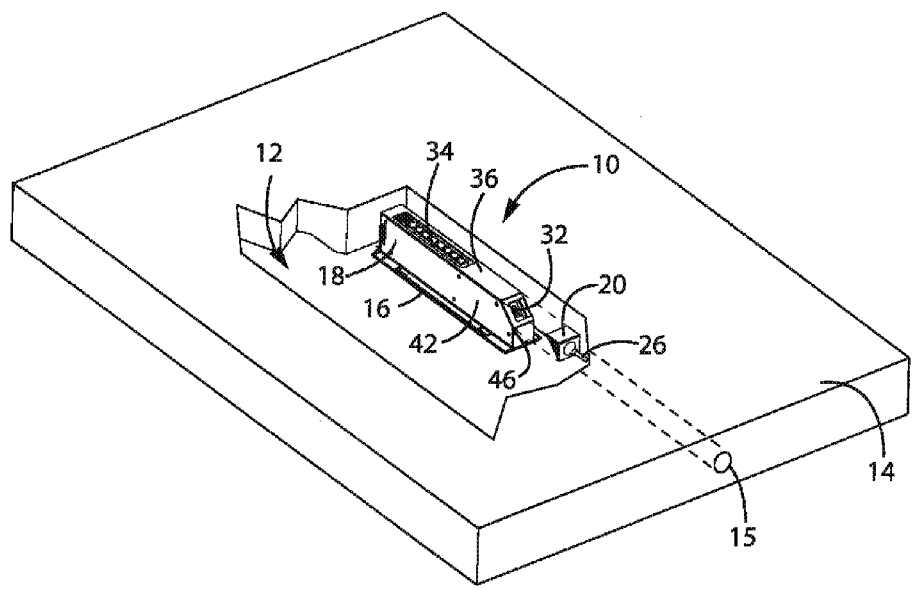
FIG. 1A is an isometric view of a network device, viewed from a location above and generally in front of the network device, showing the network device installed within a recess of a tabletop and the power cord assembly aligned with the network device to attach in a first orientation.
Figure 1B:
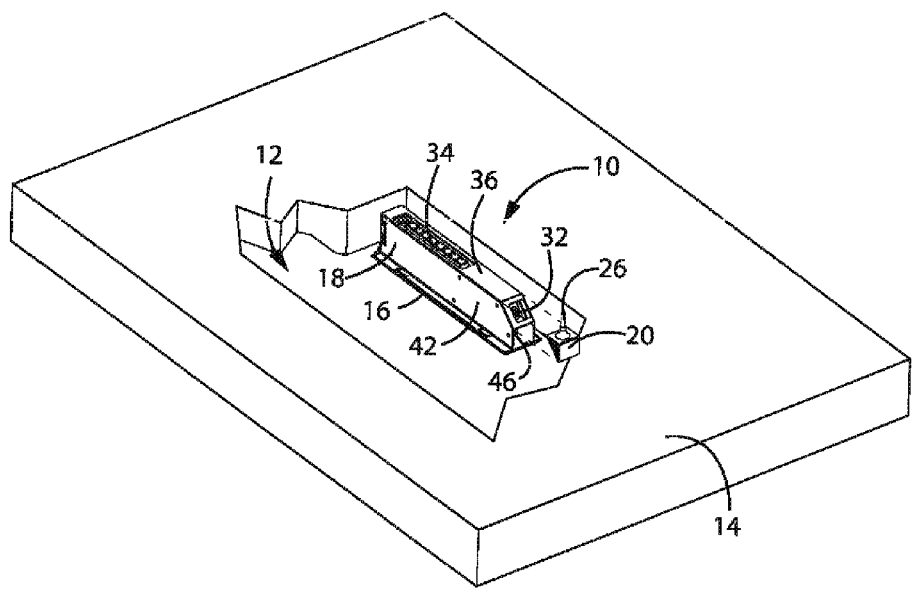
FIG. 1B is an isometric view of the network device of FIG. 1A with the power cord assembly rotated 180 degrees and aligned with the network device to attach in a second orientation.
Figure 2:
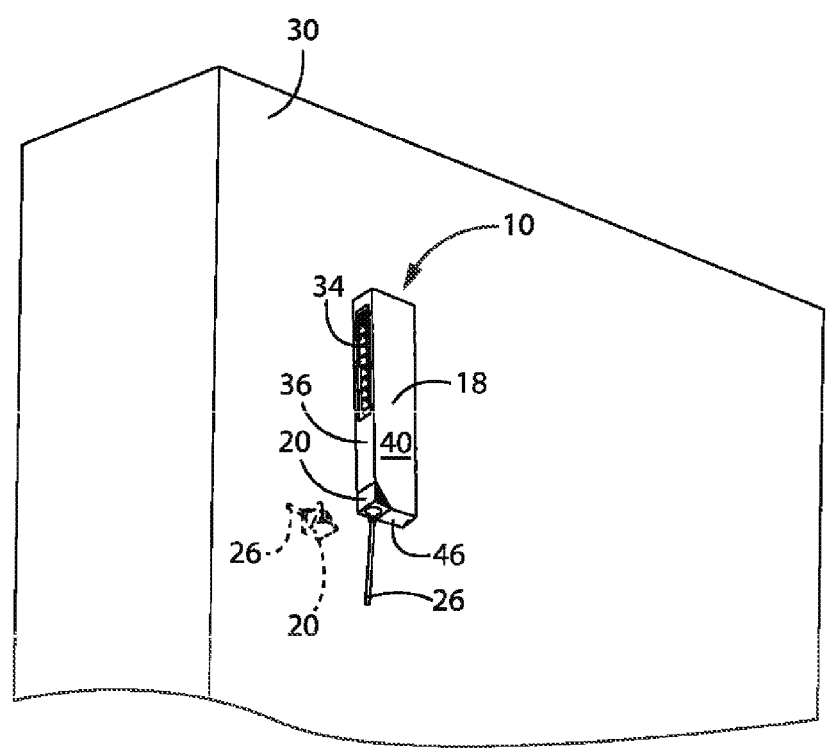
FIG. 2 is an isometric view of a network device, showing the network device installed on a vertical wall and the power cord assembly in a first orientation in solid lines and in a second orientation in phantom lines.

FIGS. 1 and 2 are isometric views of a switch 10 installed within a recess 12 of a tabletop 14. The tabletop 14 may be part of a desk, a laboratory bench, a work station, or another work surface. It is understood that the switch 10 may be installed in many different environments and configurations; however, the environment shown in FIGS. 1 and 2 is shown to illustrate the advantages of the present invention in adapting the positioning of the switch 10 to that particular environment.

Referring now to FIGS. 1 through 4, isometric and top plan views of the switch 10 are shown. In FIGS. 1A and 1B, the switch 10 is mounted on a base 16 located within a recess 12 of the tabletop 14. The switch 10 includes an enclosure or housing 18 secured to the base 16; and a power cord assembly 20 coupled at a corner of the enclosure 18 to deliver power to the enclosure 18. The base 16 may be mounted to a variety of surfaces and/or objects in a variety of environments. The enclosure 18 is removably coupled to the base 16 to selectively secure the base 16 to the mounting surface in multiple different enclosure 18 positions. The engagement of the enclosure 18 to the base 16 will be further discussed herein. The power cord assembly 20 is removably coupled to the enclosure 18 to deliver power to the switch 10. The orientation of the power cord assembly 20 relative to the enclosure 18 can be varied to and allow the cord to extend from the enclosure 18 in any of at least two different directions. The engagement of the power cord assembly 20 to the enclosure 18 will also be further discussed herein.

Referring still to FIGS. 1 through 4, the operative electronic components of the switch 10 are housed within the enclosure 18. Located in the enclosure 18 is a plurality of ports 34 for receiving data cables for connection to other network devices; and a female socket or power port 32 for receiving a male connector 24 of the power cord assembly 20 for powering the switch 10. The enclosure 18 may be made of metal or a plastic material. It has a plurality of walls defining a generally rectangular volume. These walls include a front wall 36 extending a length of the rectangular volume and having the ports 34 formed in it. The front wall 36 is joined on its left and right sides by a left sidewall 44 and right sidewall 46, respectively, extending a width of the rectangular volume. A top 40 and bottom 42 wall are joined to the upper and lower edges, respectively, of the front wall 36 and left 44 and right 46 sidewalls. A rear wall 38 is positioned opposite the front wall 36. The top 40 and bottom 42 wall and rear wall 38 also extend a length of the rectangular volume. It should be emphasized that the terms "top", "bottom", etc. are used strictly to provide a convenient frame of reference resulting from the illustrated orientation of the enclosure 18 in FIG. 4. In reality, the enclosure 18 can be mounted on a support in any orientation.

While the front wall 36 is characterized as receiving the ports 34, it is possible that any of the remaining walls may also receive ports and/or other structures such as indicators or switches.

The ports 34 are arranged in a linear fashion along the length of the front wall 36. It is contemplated that a larger enclosure 18 may accommodate multiple rows of ports which are stacked on top of each other, or that the length of the front wall 36 may be extended to a greater length to accommodate a larger number of ports. The ports 34 may be any type suitable for receiving data cables for connecting network devices, such as USB ports or Ethernet ports. Also, any number of ports 34 may be provided. For example, the enclosure 18 may include an 8-port configuration, a 16-port configuration, or a 32-port configuration.

The power port 32 is located within the enclosure 18. In the illustrated embodiment, the power port 32 is located at a corner of the housing 18. For example, the corner between the front wall 36 and the right sidewall 46 may be cut to provide an angled planar surface 70. The power port 32 may be found within the surface 70. However, the power port 32 may be located at any surface of the enclosure 18.

The socket or power port 32 may be a female receptacle for receiving a male connector. For example, the power port 32 may be a symmetric, "figure 8" or "shotgun" connector input (e.g., IEC 60320-C7/C8). The symmetric shape of the power port 32 allows the connector 24 to be inserted into the power port in either of two orientations. The two orientations are determined by rotating the plug body 22 by 180 degrees as described below. It is contemplated that other power port 32 and connector 24 configurations may be used, so long as the connector 24 is connectable to the power port 32 in more than one orientation thereof. Alternatively, the socket or power port 32 could be a male connector for mating with a female receptacle on the plug body 22.

Referring still to FIGS. 1 through 4, the power cord assembly 20 includes a plug body 22 taking the form of a triangular segment having three surfaces forming a triangular cross section, and joined on corresponding sides by opposing top and bottom surfaces. The plug body thus as first, second, and third planar surfaces 50, 52, 54. In this arrangement, the second surface 52 extends from the first surface 50 at an acute angle, and the first and second surfaces are joined by the third surface 54 to form the legs of the triangle. The resulting triangle may be an isosceles right triangle in which the second and third walls 52 and 54 form the legs and are of equal length to one another and the first wall 50 forms the hypotenuse. The second and third walls have an included angle of 90°, and the first and second walls and first and third walls each have an included angle of 45°. In the illustrated embodiment, each of the second and third wall is about 30 mm long and the first wall is about 40 mm long. Each wall 50, 52, 54 is about 35 mm deep. A top 56 and bottom 58 wall are joined to the upper and lower edges, respectively, of the first 50, second 52, and third 54 surfaces to enclose the triangular segment. The top 56 and bottom 58 walls extend in parallel planes that are perpendicular to the first, second, and third edges. The connector 24 extends perpendicularly from the center of the first surface 50, and a power cable 26 extends from the second planar surface 52 of the plug body 22 adjacent a first surface 50. The cable 26 terminates in a plug that is connectable to a source of electricity via, e.g., a wall socket or extension cord. The cable 26 may either be fixed to the second surface 52, in which case its wires would likely be affixed to connectors within the body 22, or include a plug removably connectable to a socket in the second surface 52.

Referring to FIG. 1 through FIG. 5, the male connector 24 of the power cord assembly 20 is coupled to the female connector input or power port 32 of the enclosure 18 by aligning the male connector 24 with the female connector input or power port 32. In this respect, the first surface 50 is aligned with planar surface 70 of the enclosure 18 so that the first surface 50 is substantially parallel to the planar surface 70. The triangular segment formed by the plug body 22 aligns with the cut corner of the housing 18 so as to effectively replace the conceptually missing corner of the housing 18 so that each of the second and third surfaces 52 and 54 is collinear with and effectively forms an extension of one of the front wall 36 and the right side wall 46 of the enclosure. The male connector 24 is inserted into the female connector input or power port 32 so as to connect the internal power supplies of the enclosure 18 to the power source at the opposite end of the cable 26.

The position and direction of extension of the cable 26 relative to the enclosure 18 will depend on the orientation of the male connector 24 relative to the enclosure 18. For example, if the male connector 24 is coupled to the enclosure 18 with the third wall 54 of the body 22 extending collinearly with the front wall 36 of the enclosure 18 and the second wall 52 extending collinearly with the right side wall 46 as shown in solid lines in FIGS. 3 and 4, the cable 26 extends horizontally outward from the enclosure 18 as shown in FIG. 1A, which may interfere with the use of the tabletop 14 unless the tabletop 14 includes a chase 15 allowing the cable 26 to extend through a sidewall of the recess 12 and outward through a side of the tabletop 14. However, if the chase is not present, it may be desired to reposition the cable 26, for example, to the position as shown in FIG. 1B and in phantom lines in FIGS. 3 and 4, in which the second wall 52 of the body 22 extends collinearly with the front wall 36 and the third wall 54 extends collinearly with the right side wall 46. The cable 26 will then extend vertically upward, such as through an upper opening of recess 12, such that the cable 26 will not interfere with the sidewalls of the recess 12. The plug body only need be rotated 180° about an axis extending perpendicularly from the surface 50 and being collinear with an axial centerline of the connector 24 to achieve this reorientation, with a resulting repositioning of the cable by 90°.

Referring now to FIG. 2, in another example, changing the orientation of the plug body 22 relative to the enclosure 18 may also be helpful when mounting the enclosure 18 onto a vertical wall 30. For example, in the plug body orientation shown in phantom lines in FIGS. 3 and 4, in which the second wall 52 of the body 22 extends collinearly with the front wall 36 and the third wall 54 extends collinearly with the right side wall 46, the cable 26 extends perpendicularly to the length of the enclosure 18 and perpendicularly away from the surface of the wall, as seen in phantom lines in FIG. 2. However, if the male connector 24 is coupled to the enclosure 18 with the third wall 54 of the body 22 extending collinearly with the front wall 36 of the enclosure 18 and the second wall 52 extending collinearly with the right side wall 46 as shown in solid lines in FIGS. 3 and 4, the cable 26 extends vertically downward from the enclosure 18, as seen in solid lines in FIG. 2. This orientation may be preferred because the cable 26 extends downward along the vertical wall 30 so that it may be inserted into a wall socket (not shown) near the bottom of the vertical wall 30, and does not unnecessarily protrude outward from the enclosure 18.

Referring now to FIGS. 6 through 9, the enclosure 18 is shown being mounted to a base 16 or bracket for attachment to a mounting surface and/or object. The base 16 may be mounted to any desired mounting surface and/or object. For example, the base 16 may be attached to a table, wall, leg or pole. The base 16 may include a number of holes 72, e.g., two holes, for receiving screws or other fasteners for mounting the base 16 to a mounting surface, such as a table or wall. The mounting surface may be horizontal, vertical, or inclined, or the base may be mounted on the underside of a surface, such as on the underside of a table, to allow the base 16 to extend downward from the underside of a tabletop. Alternatively, straps may be used to mount the base 16 to a cylindrical or tubular support such as table leg or pole. Any of a variety of mounting mechanisms may be utilized to mount the base 16 to a surface and/or object.

Figure 6:
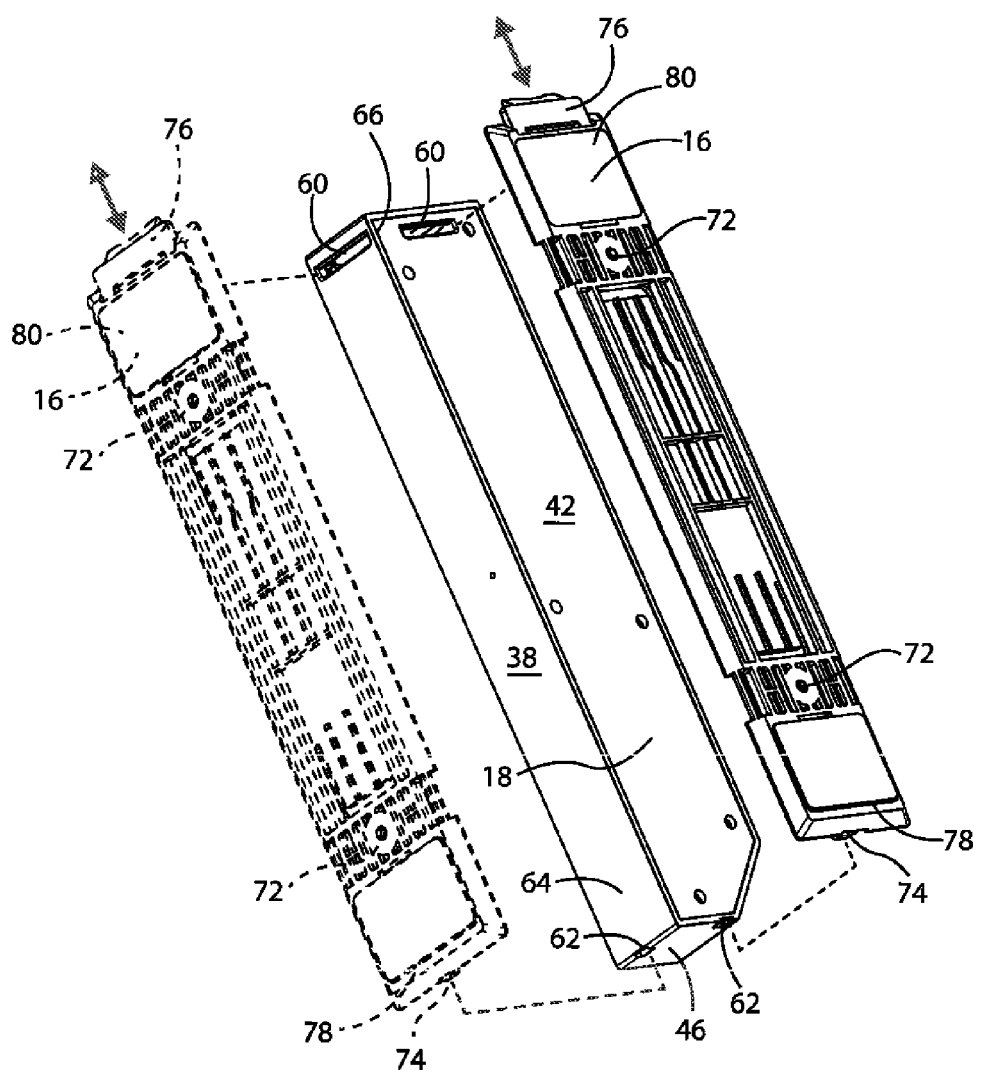
FIG. 6 is an isometric view, showing the network device aligned to couple with a base, the base attachable on two adjacent perpendicular sides of the network device, a first attachment in solid lines and a second attachment in phantom lines.
Figure 8:
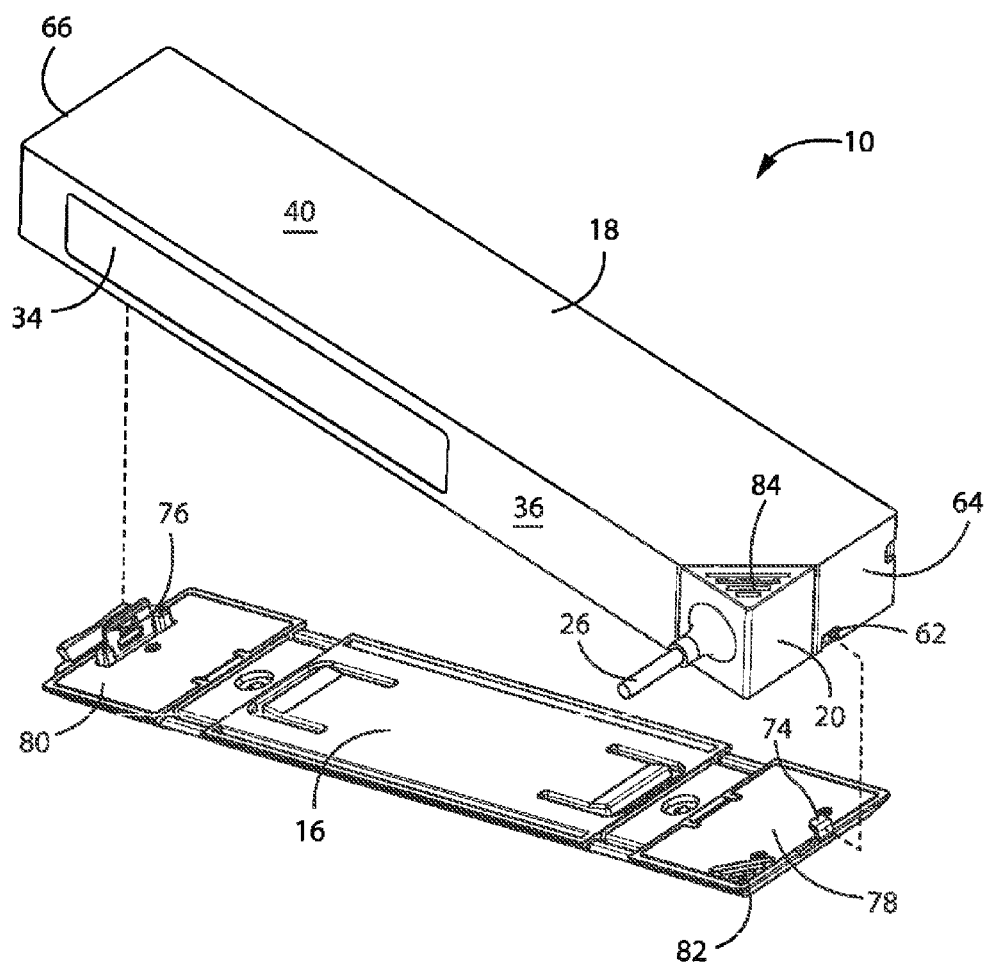
FIG. 8 is an isometric view of the network device, viewed from a location above and generally in front of the network device, showing alignment of the network device with the base in a horizontal orientation.
Figure 9:
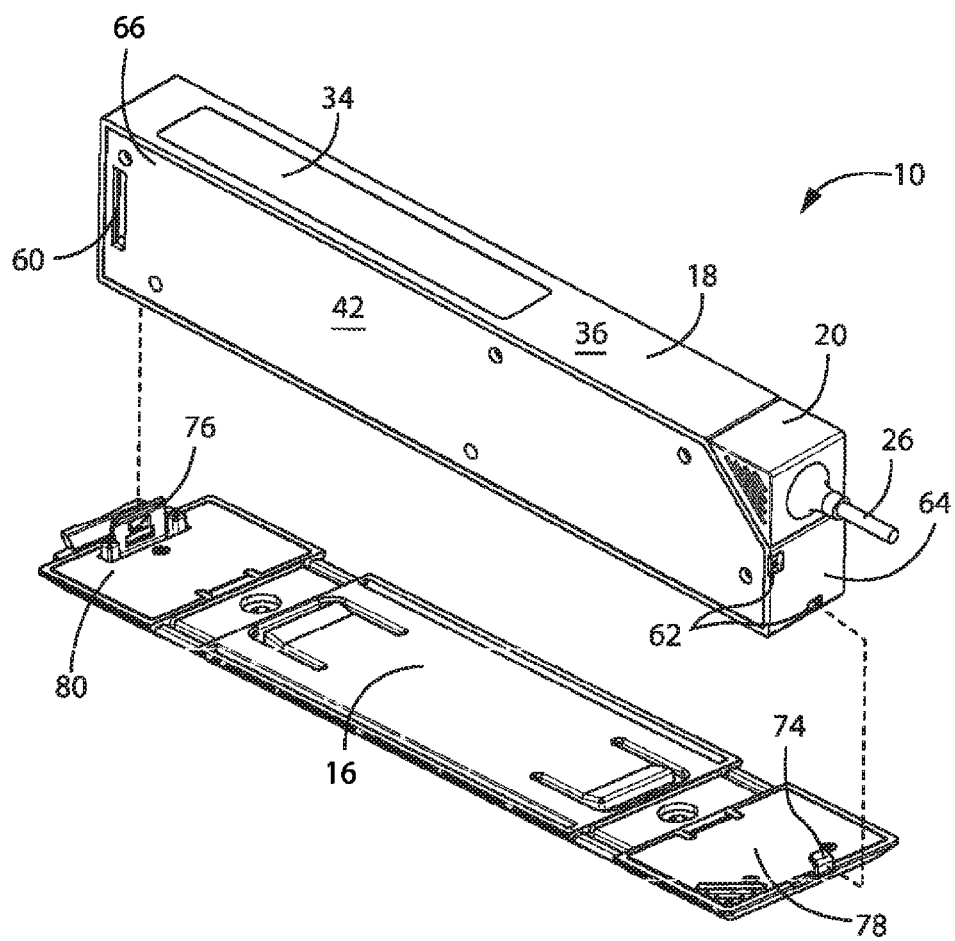
FIG. 9 is an isometric view of the network device, viewed from a location above and generally in front of the network device, showing alignment of the network device with the base in a vertical orientation.

The enclosure 18 may be coupled to the base 16 at multiple sides of the enclosure 18 as seen in solid and phantom lines of FIG. 6. For example, the enclosure 18 may be coupled to the base 16 on either of two adjacent sides of the enclosure 18. In this respect, the enclosure 18 may be mounted to the mounting surface in a "horizontal" orientation in which the plurality of ports 34 are accessible from a front side (FIGS. 2-4; solid lines of FIG. 6; FIG. 8), or a "vertical" orientation in which the plurality of ports 34 are accessible from a top side (FIG. 1; phantom lines of FIG. 6; FIG. 9). For example, it may be desirably to position the enclosure 18 "horizontally" when the enclosure 18 is mounted underneath a table or on a wall (FIG. 2). However, it may be desirable to position the enclosure "vertically" when the enclosure 18 is placed within the recess 12 of a tabletop 14 (FIGS. 1A and 1B).

Figure 7:
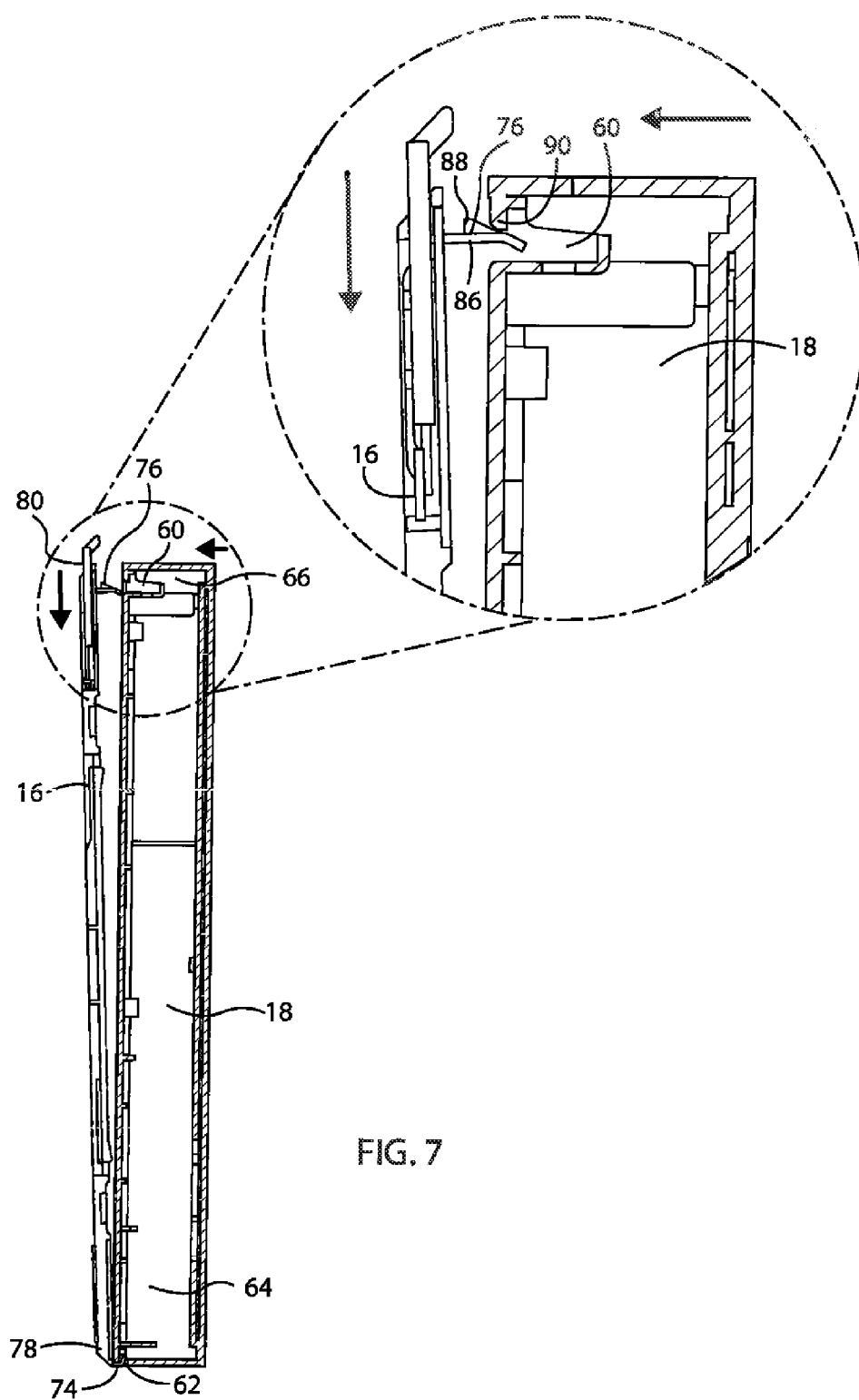
FIG. 7 is a side sectional view of the network device attached to the base and illustrating the latch assembly of the base in greater detail.

Referring to FIGS. 6 and 7, the housing 18 includes a number of apertures for assisting in the attachment of the enclosure 18 to the base 16. A first end 64 of the switch housing 18 includes a notched opening 62 at an edge of a sidewall. The notched opening 62 is generally rectangular in shape. The sidewall corresponding with the notched opening 62 includes a rectangular slot 60 at a second end 66 opposite the first end 64. The apertures are located in at least two adjacent sidewalls of the housing 18 so that the housing 18 may be mounted "horizontally" or "vertically", as desired. For example, the rectangular slot 60 may be located at the second end 66 of the bottom wall 42 and at the second end 66 of the rear wall 38, and the corresponding notched opening 62 located at the first end 64 of the bottom wall 42 and at the first end 64 of the rear wall 38 along the edge meeting the right wall 46.

Referring to FIGS. 8 and 9, isometric views of the enclosure 18 being attached to the base 16 in two alternate orientations are shown. The base 16 includes a number of latches for assisting in the attachment of the enclosure 18 to the base 16. The base 16 includes an alignment hook 74 located at a first end 78 of the base 16. Hook 74 corresponds with the size and shape of the notched opening 62 in the bottom wall 42 of the enclosure 18. The base 16 also includes a securing latch 76 at the second end of the base 16, which corresponds with the size and shape of the rectangular slot 60 in the bottom wall of the enclosure 18.

As seen in FIG. 8, showing the "horizontal" orientation, the alignment hook 74 of the first end 78 of base 16 aligns with the notched opening 62 of the first end 64 of the enclosure bottom wall 42, and the securing latch 76 of the second end 80 aligns with the rectangular slot 60 of the second end 66 of the enclosure bottom wall 42. As seen in FIG. 9, in the "vertical" orientation, the alignment hook 74 of the first end 78 of base 16 aligns with the notched opening 62 of the first end 64 of the rear wall 38 of the enclosure, and the securing latch 76 of the second end 80 aligns with the rectangular slot 60 of the second end 66 of the rear wall 38.

As seen in the side sectional view in FIG. 7, once aligned with the base 16, the enclosure 18 is attached to the base 16 by inserting the alignment hook 74 into the notched opening 62 to secure the first end 64 of the housing 18 to the first end 78 of the base 16. The alignment hook 74 is generally inserted into the notched opening 62 by sliding the housing 18 toward the first end 78 of the base 16. Then, as shown in the enlarged view, the second end 66 of the housing 18 is pivoted toward the base 16 so that the securing latch 76 is inserted into the rectangular slot 60 to secure the second end 66 of the housing 18 the second end 80 of the base 16. The securing latch 76 has an outwardly extending tab 86 with a locking barb 88 extending inwardly toward the base 16. The locking barb 88 is engageable with a lip 90 of the rectangular slot 60 when the latch 76 is inserted into the slot 60. The angled configuration of the locking barb 88 facilitates the insertion of the securing latch 76 into the rectangular slot 60 while locking the tab 86 within the slot 60 once the locking barb 88 has been extended within the slot 60 to a significant extent. When engaged, the locking barb 88 is "clicked" into the rectangular slot 60. The locking barb 88 may be removed from the rectangular slot 60 by pivoting the locking barb away from the lip 90. The pivoting movement of the locking barb 88 may be facilitated by an arm located at the second end of the base 16 whereby pivotal motion of the arm rotates the locking barb 88 away from the lip 90. Once the locking barb 88 is moved away from the lip 90, the locking barb 88 may move past the lip 90 and the securing latch 76 may be removed from the rectangular slot 60. The securing latch 76 may then be removed from the rectangular slot 60, and thus, the housing 18 and the base 16 separated. It is contemplated that other attachment mechanism may be used to attach the enclosure 18 to the base 16, such as magnets or hook and loop fasteners.

Figure 3:
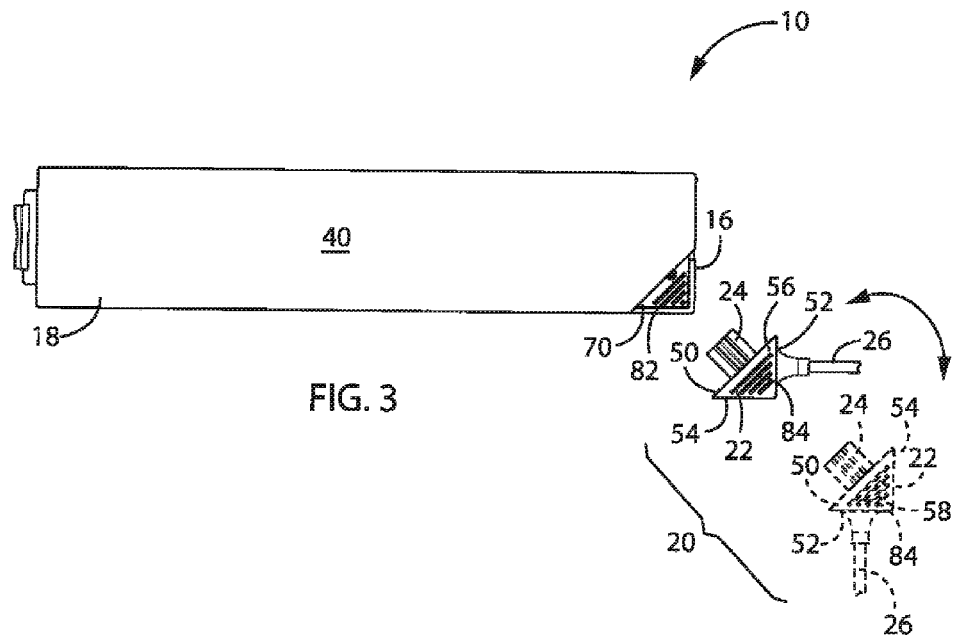
FIG. 3 is a top plan view of the network device removed from the wall and showing a power cord assembly in a first orientation in solid lines and in a second orientation in phantom lines.
Figure 4:
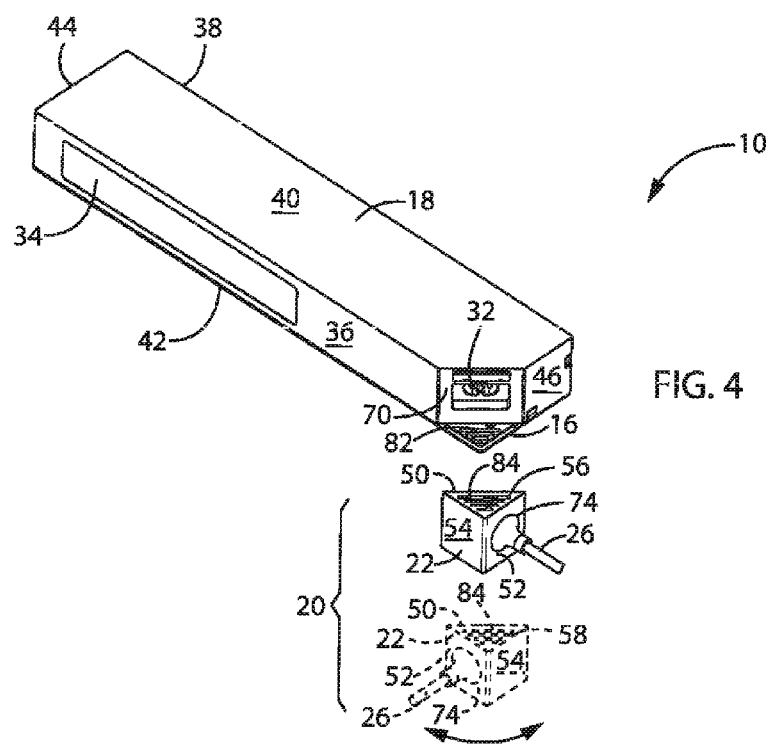
FIG. 4 is an isometric view of the network device of FIG. 3, viewed from a location above and generally in front of the network device, showing the connector of the power cord assembly aligned with the network device in a first orientation in solid lines and in a second orientation in phantom lines.
Figure 5:
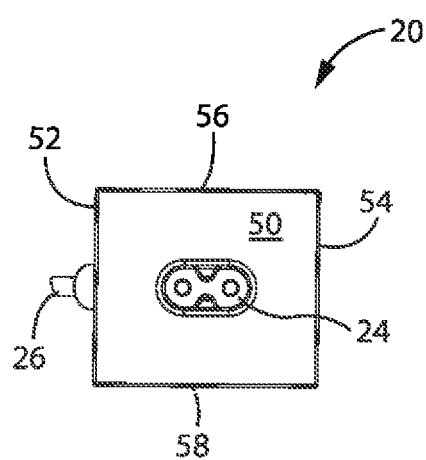
FIG. 5 is an elevation view of a face of a plug body of the power cord assembly.

Referring to FIGS. 3,4 and 8, the coupling of the power cord assembly 20 to the enclosure 18 may be further assisted by the base 16 when the enclosure 18 is attached to the base 16 in the "horizontal" orientation (FIG. 8). In the "horizontal" orientation, a corner of the base 16 extends outward from the cut corner of the housing 18 when the enclosure 18 is installed to the base 16. The corner of the base 16 includes a plurality of locking grooves 82 for mating with corresponding grooves 84 of the power cord assembly's plug body 22. For example, the grooves 82 of the base 16 may be protrusions, while the corresponding grooves 84 of the plug body 22 may be recesses. The corresponding grooves 84 may be located on the top 56 and bottom 58 wall of the plug body 22 so that rotation of the power cord assembly 20 between the first and second position allow the grooves 82, 84 to mate in either position. The direct attachment of the plug body 22 to the base 16 prevents the user from removing the power cord assembly 20 from the enclosure 18 without removing the enclosure 18 from the base 16 first. This prevents the power cord assembly 20 from being accidently removed.

Figure 10:
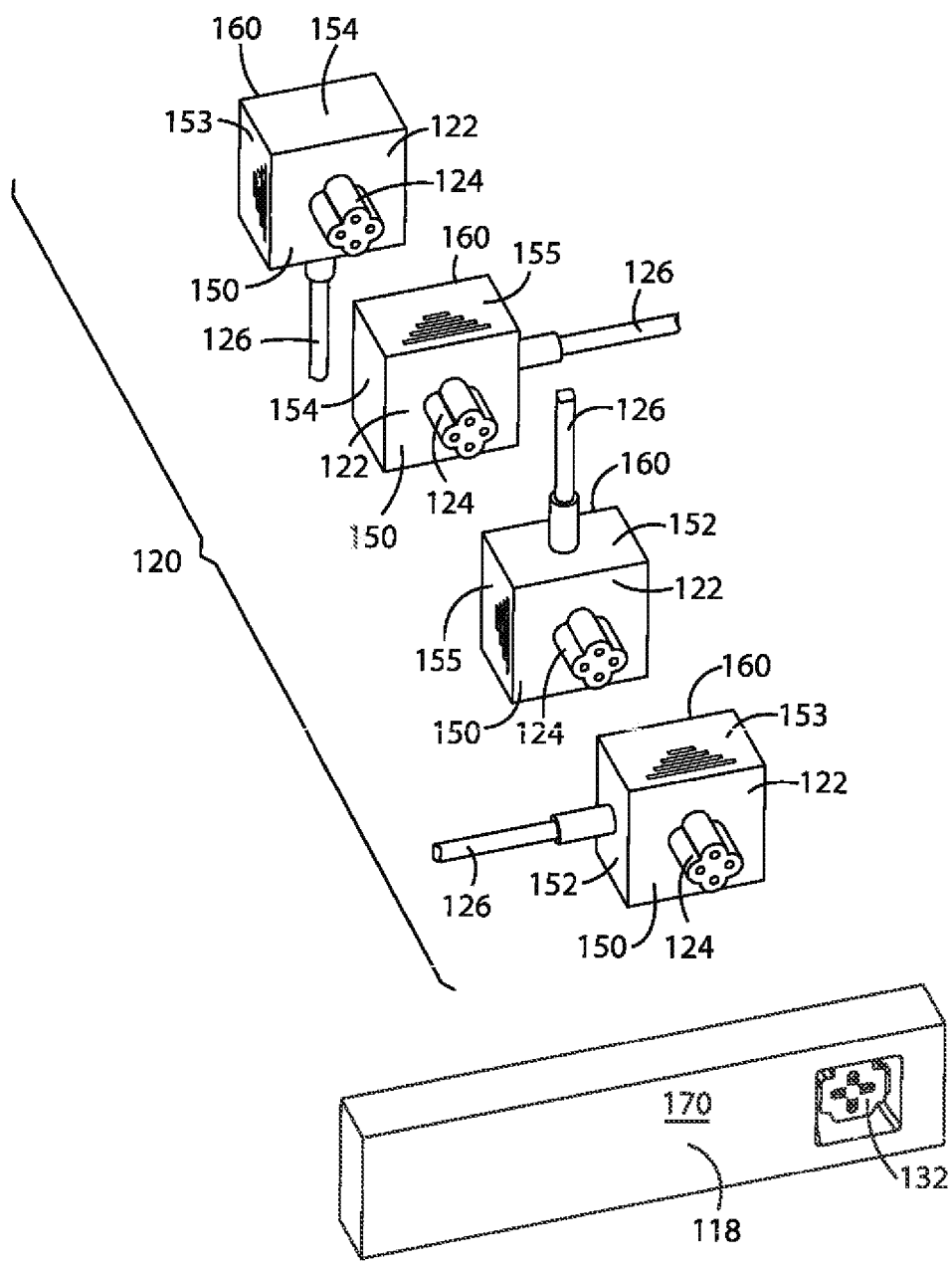
FIG. 10 is an isometric view showing a four-prong power cord assembly constructed in accordance with the invention and connectable to a network device in four different orientations.

Referring to FIG. 10, an alternative embodiment of an enclosure 118 and a power cord assembly 120 is shown. The enclosure 118 and power cord assembly 120 are similar to the enclosure 18 and power cord assembly 120 of the first embodiment except for the shape of the plug body 122, and the type of connector and connector input. Elements of this alternative embodiment that correspond to the first embodiment are designated the same reference numeral, incremented by 100. The description of some elements that are conceptually identical to those of the first embodiment is omitted entirely, it being understood that the same description applies equally to this embodiment. In this alternative embodiment, a plug body 122 of the power cord assembly 120 is of square cross section rather than triangular. It thus has four surfaces 152, 153, 154, 155 of equal length connected to one another at right angles. Each surface may be 40 mm long. The surfaces are bounded at their inner edges by a front surface 150 and at their outer edges by a rear surface 160. A connector 124 extends perpendicularly forwardly from the front surface 150 of the plug body 122 for insertion into a mating power port 132 on a surface 170 of the enclosure housing 118. The connector 124 of this embodiment is a four-prong "cloverleaf" connector that can be inserted into the power port 132 in any of 4 mutually orthogonal orientations. A cable 126 extends from the side surface 152 of the plug body 122. Depending on the orientation of the plug body 122 relative to the enclosure 118, the cable 126 may extend outward in any of four different mutually orthogonal directions. This versatility of plug positioning allows for even greater flexibility in positioning of the cable 126 than the first embodiment.

In is contemplated that the alternative embodiment may also incorporate any of the features of the previous embodiment described above but many of these elements are abbreviated or even eliminated in the interest of brevity.

Many other changes and modifications could be made to the invention without departing from the spirit thereof.

For example, the location and positioning of the power socket on the switch enclosure may vary, while still allowing the power cord assembly to be inserted at more than one orientation.

Also, the shape of the power cord body may vary. For example the plug body may have a triangular, rectangular, round, or other shaped cross section. However, regardless of the shape, the cord may still selectively extend from in at least two different directions, depending on the orientation of installation, such that the user may selectively choose the positioning of the cord when coupled to the switch.

The scope of these changes and modifications will become apparent from the appended claims.

What we claim is:

1. A network device for communicating with a network comprising:
    a housing having a power port; and
    a power cord assembly comprising
        a plug body having a first surface and a second surface;
        a connector extending from the first surface and connectable to the power port in first and second discrete orientations, the connector being incapable of being connected to the power source in any orientation between the first and second orientations; and
        a power cable extending from the second surface, wherein the second surface is offset from the first surface and extends in a first direction relative to the housing when the connector is connected to the power port in the first orientation thereof and in a second direction relative to the housing when the connector is connected to the power port in the second orientation thereof.

2. The network device of claim 1, wherein the power port input is a female receptacle and the connector is a male connector.

3. The network device of claim 1, wherein the second surface is offset approximately 90 degrees from the first surface.

4. The network device of claim 1, wherein the second surface is offset less than 90 degrees from the first surface.

5. The network device of claim 1, wherein the power port is located at an inclined surface on a corner of the housing.

6. The network device of claim 1, wherein the plug body has a triangular cross section and the plug body is connectable to the housing in either of exactly two orientations that are offset from one another by 180°.

7. The network device of claim 1, wherein the plug body has a rectangular cross section and the connector body is connectable to the housing in any of exactly four mutually orthogonal orientations.

8. The network device of claim 1, further comprising a base to which the housing is attached and via which the housing is mounted on a support, wherein the base is selectively attachable to at least two perpendicular sides of the housing.

9. The network device of claim 8, further comprising a latch assembly that contributes to the attachment of the housing to the base, the latch assembly comprising an aperture formed within the housing and at a latch on the base, the latch being configured to be insertable into the aperture.

10. A power cord assembly for connection to a network device having a housing, the power cord assembly comprising:
    a housing having a power port; and
    a power cord assembly comprising
        a plug body having a first surface and a second surface;
        a connector extending from the first surface and connectable to the power port in first and second discrete orientations, the connector being incapable of being connected to the power source in any orientation between the first and second orientations; and
        a power cable extending from the second surface, wherein the second surface is offset from the first surface and extends in a first direction relative to the housing when the connector is connected to the power port in the first orientation thereof and in a second direction relative to the housing when the connector is connected to the power port in the second orientation thereof.

11. The power cord assembly of claim 10, wherein the connector is a male connector.

12. The power cord assembly of claim 10, wherein the second surface is offset approximately 90 degrees from the first surface.

13. The power cord assembly of claim 10, wherein the second surface is offset less than 90 degrees from the first surface.

14. The power cord assembly of claim 10, wherein the plug body has a triangular cross section and the plug body is connectable to the housing in either of exactly two orientations that are offset from one another by 180°.

15. The power cord assembly of claim 10, wherein the plug body has a rectangular cross section and the connector body is connectable to the housing in any of exactly four mutually orthogonal orientations.

16. A method of connecting a power plug to a network device for powering the device comprising the steps of
    providing a network device comprising a housing presenting a power port;
    providing a power cord assembly including a plug body having a first surface and a second surface, a connector extending from the first surface and a power cord extending from the second surface;
    connecting the connector to the power port with the plug body in first and second discrete orientations, the connector being incapable of being connected to the power source in any orientation between the first and second orientations in which a power cable extends from the second surface, wherein the second surface is offset from the first surface and extends in a first direction relative to the housing when the connector is connected to the power port in the first orientation thereof and in a second direction relative to the housing when the connector is connected to the power port in the second orientation thereof.

17. The method as recited in claim 16, wherein the plug body has a triangular cross section and the plug body is connectable to the housing in either of exactly two orientations that are offset from one another by 180°.

18. The method as recited in claim 16, wherein the plug body has rectangular cross section and the plug body is connectable to the housing in either of exactly four orientations that are offset from one another by 90°.

19. The method as recited in claim 16, further comprising the step of mounting the network device to a base.

20. The method as recited in claim 19, wherein the network device is attachable to the base on either of at least two perpendicular sides of the housing.

\* \* \* \* \*